United States Patent

Morikawa

[11] Patent Number: 5,994,724
[45] Date of Patent: Nov. 30, 1999

[54] PHOTODETECTOR

[75] Inventor: Takenori Morikawa, Tokyo, Japan

[73] Assignee: NEC Corporation, Tokyo, Japan

[21] Appl. No.: 08/965,342

[22] Filed: Nov. 6, 1997

[30] Foreign Application Priority Data

Dec. 3, 1996 [JP] Japan ................................. 8-323107

[51] Int. Cl.$^6$ ............................................. H01L 31/0328
[52] U.S. Cl. .......................... 257/184; 257/431; 257/432; 257/448; 257/466
[58] Field of Search ............................ 257/19, 436, 184, 257/185, 186, 432, 448, 466, 431

[56] References Cited

U.S. PATENT DOCUMENTS

| | | | |
|---|---|---|---|
| 4,507,674 | 3/1985 | Gaalema | 257/436 |
| 4,847,210 | 7/1989 | Hwang et al. | 438/59 |
| 5,576,221 | 11/1996 | Takemura et al. | 438/257 |
| 5,726,440 | 3/1998 | Kalkhoran et al. | 257/436 |

OTHER PUBLICATIONS

M. Sugiyama, et al., "A selective epitaxial SiGe/Si planar photodetector for Si–based OEICs", *IEEE*, pp. 583–586, 1995.

*Primary Examiner*—David B. Hardy
*Assistant Examiner*—Huy Bui
*Attorney, Agent, or Firm*—Foley & Lardner

[57] ABSTRACT

A photodetector design is disclosed for preventing an electrode from being broken. A recess portion is formed in a semiconductor substrate. A light absorbing layer is formed in the recess portion, and a buffer layer is formed on the light absorbing layer. A contact layer is formed on the buffer layer. The height of the light absorbing layer can be set to minimize the effect of a step caused by facet formation. An insulating layer is formed outside of a recess portion to project from a main surface of the substrate. The anode electrode is formed on the insulating layer and substantially outside of the recess and, as a result, the electrode is less likely to be broken.

6 Claims, 10 Drawing Sheets

PHOTODETECTOR

DESCRIPTION OF THE RELATED ART

The present invention relates to a photodetector.

In general, the photodetector to be used in an optical communication system is formed of a compound semiconductor such as, for example, InGaAsP. In view of good matching with the silicon process, however, a photodetector using silicon or SiGe as a material of a light absorbing layer is preferable. Recently, OEICS, (Opto-Electronic Integrated Circuits), in which a photodetector and a silicon transistor are formed on a single substrate, have been developed.

There are generally two types of photodetectors, a surface incident type and a waveguide type. In a case of the surface incident type photodetector, an incident direction of light is parallel to a thickness direction of a substrate of the photodetector and, in a case of the waveguide type photodetector, an incident direction of light is parallel to a surface of a substrate of the photodetector. As one of the methods for effectively improving the light sensitivity of the photodetector of either the surface incident type or the waveguide type, the thickness of the light absorbing layer is increased.

Figure 20:
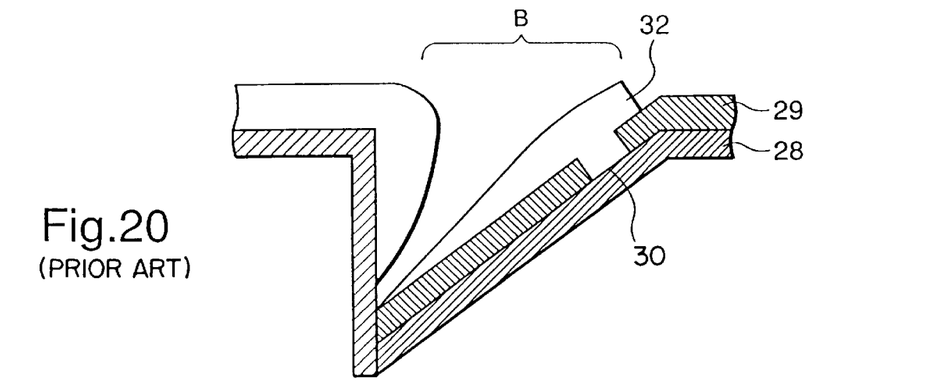
FIG. 20 shows an enlarged cross section of a B portion in FIG. 19.

That is, in the case of the surface incident type photodetector, the optical sensitivity thereof is improved by increasing the thickness of the light absorbing layer, since an incident light path in the light absorbing layer becomes longer and more light can be absorbed correspondingly thereto. On the other hand, in the case of the waveguide type photodetector, a cross sectional light receiving area for epitaxial layer formed on a (100) plane of the substrate are different from each other in energy stability. Since the growing speed on the (100) plane of the peripheral portion is lower than that on the (100) plane of the central portion, there are facets such as shown in FIG. 20 produced, by which the growing plane is inclined. The facet becomes substantially large with increase of the thickness of the light absorbing layer. As shown in FIG. 20, when the thickness of the epitaxially grown film is equal to the depth of the opening portion, the facet is produced and, in connecting the anode electrode 32 to the anode contact 30, there may be a case that the anode electrode 32 is broken due to a step resulting from the facet.

SUMMARY OF THE INVENTION

It is an object of the present invention to provide a photodetector having an upper electrode which is not broken even when a facet is produced by increasing the thickness of a light absorbing layer thereof and a method of fabricating the same photodetector.

It is another object of the present invention to provide a photodetector having an photo sensitivity improved by increasing the thickness of a light absorbing layer thereof and a method of fabricating the same photodetector.

A photodetector according to the present invention includes a semiconductor substrate, a recess portion formed in the semiconductor substrate, a light absorbing layer formed in the recess portion, a buffer layer formed on the light absorbing layer, and a contact layer formed on the buffer layer, which the recess portion is filled by the light absorbing layer, the buffer layer and the contact layer.

BRIEF DESCRIPTION OF THE DRAWINGS

The above objects and other objects, advantages and features of the present invention will be more apparent from the following description when taken in conjunction with the accompanying drawings, in which.

DETAILED DESCRIPTION OF THE PREFERRED EMBODIMENTS

Figure 1:
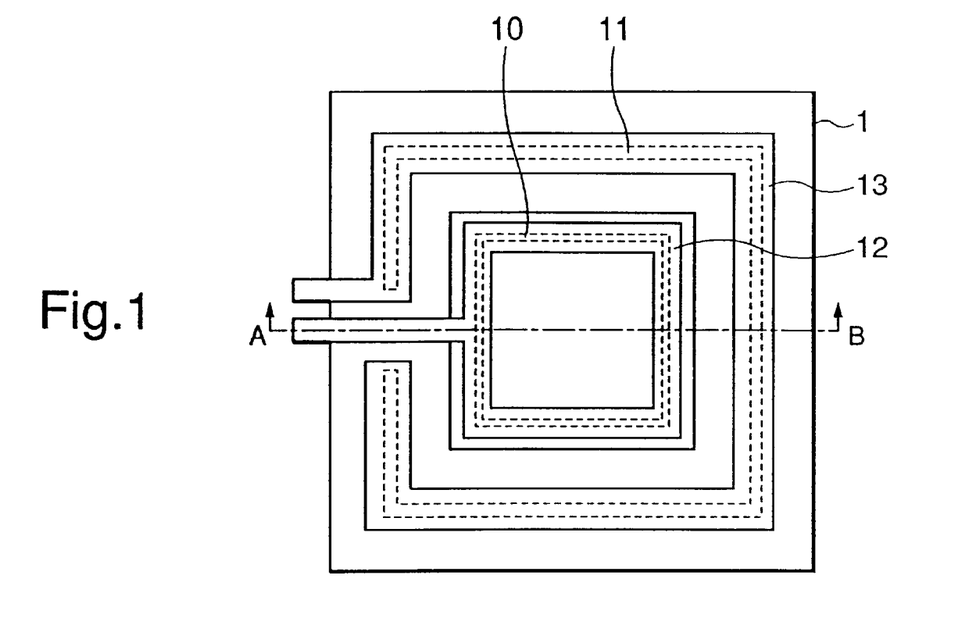
FIG. 1 shows a plan view of the photodetector according to a first embodiment of the present invention.
Figure 2:
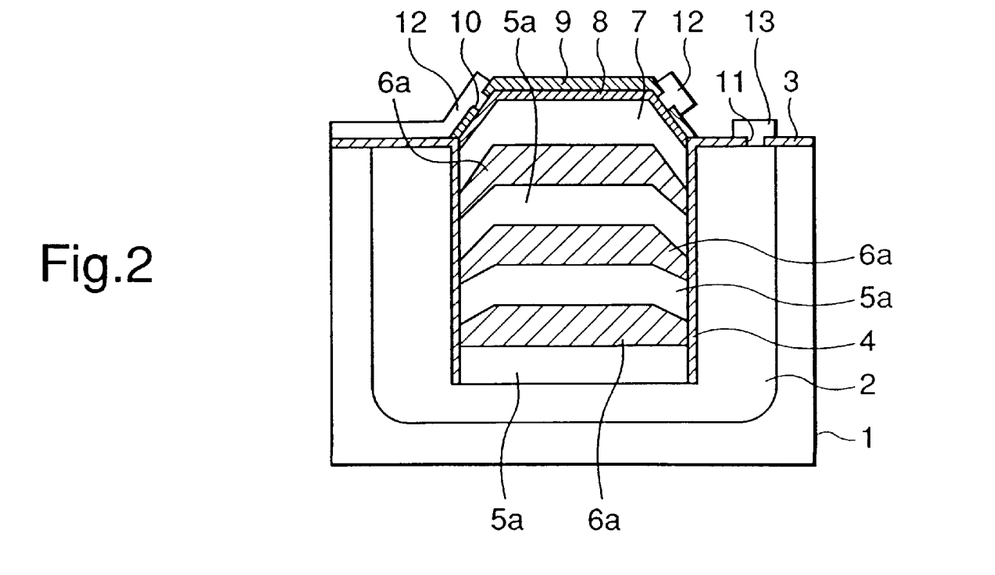
FIG. 2 shows a cross sectional view taken along a line A–B in FIG. 1.

A photodetector as shown in FIGS. 1 and 2 is of the surface incident type which is formed in a portion of a silicon substrate 1 and detects light incident on the photodetector through a surface of the silicon substrate 1. In other portions of the silicon substrate 1, various circuits (not shown) including a transistor, etc., are formed.

The photodetector is formed in a high impurity density N type diffusion layer 2, which is formed in a P type silicon substrate 1. The photodetector also can be formed in the P type region of the silicon substrate 1 directly. That is, in a recess formed in the N type diffusion layer 2, epitaxial fsilicon layers 5a and epitaxial SiGe layers 6a are laminated alternately as shown in FIG. 2. On these epitaxial layers, a silicon buffer layer 7 and a P$^+$ type contact layer 8 are formed in this order.

A plan shape of the recess is square having an area of, for example, 70~80 $\mu m^2$ and is 1~3 $\mu m$ deep. Since the impurity concentration of the layers 5a and 6a related to the light absorption is very low (not higher than $1 \times 10^{15}$ cm$^{-3}$), the epitaxial SiGe layer 6a and the silicon layer 5a are 200~400 $\mu m$ thick, respectively. That is, these layers are composed of intrinsic layers or low impurity density P type layers. The impurity concentration of the N type diffusion layer 2 is not less than $1 \times 10^{19}$ cm$^{31\ 3}$, the silicon buffer layer 7 is 200~500 nm thick and has the impurity concentration not more than $1 \times 10^{15}$ cm$^{-3}$ and the P$^+$ type silicon contact layer 8 is 100~200 nm thick and has the impurity concentration not less than $1 \times 10^{19}$ cm$^{-3}$.

A cover oxide film 9 and a mask oxide film 3 having the same thickness as that of the cover oxide film 9 are formed on the surface of the silicon substrate 1. Further, an anode electrode 12 and a cathode electrode 13 of the photodetector are provided through an anode contact hole 10 provided in the cover oxide film 9 and a cathode contact hole 11 provided in the mask oxide film 3.

A fabrication steps of the photodetector will now be described with reference to FIGS. 3 to 6.

Figure 3:
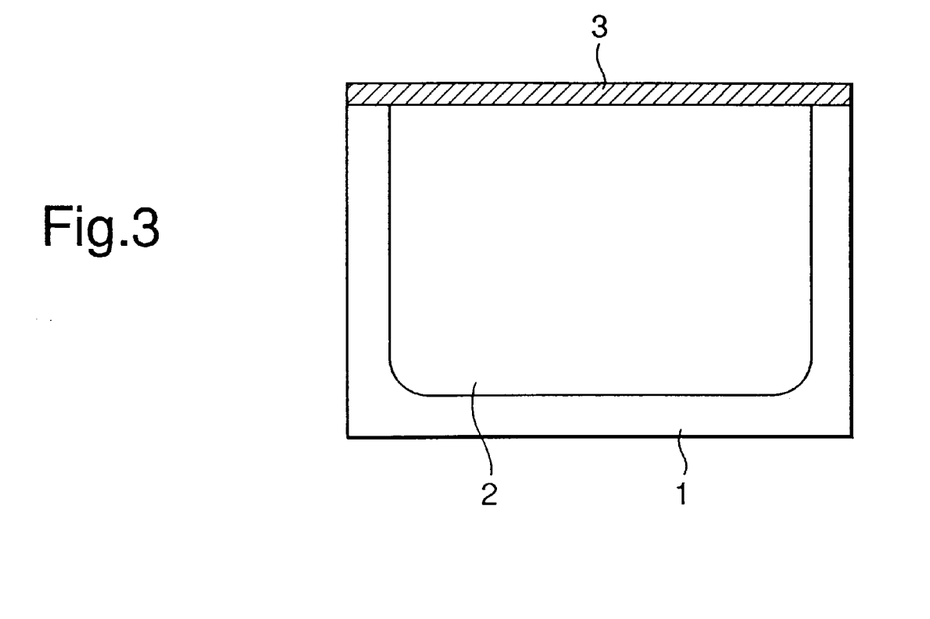
FIGS. 3 to 6 show cross sectional views indicating fabrication steps of the photodetector shown in FIG. 1.

First, as shown in FIG. 3, the N type diffusion layer 2 is formed in the silicon substrate 1 of, for example, P type, by forming a resist mask (not shown) on the substrate 1, selectively implanting arsenide ion through the resist mask to the silicon substrate 1 at a dose of about $1\times10^{15}$ cm$^{-2}$ and, then, heat-treating it at a temperature not lower than 1000° C. Thereafter, the mask oxide film 3 is grown on the whole surface of the wafer.

Figure 4:
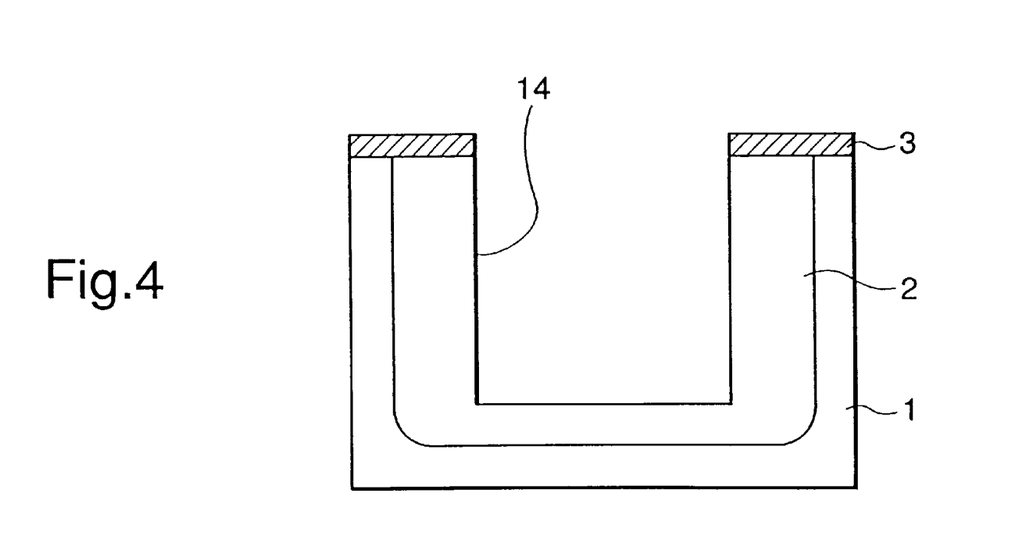

Then, a portion of the mask oxide film 3, in which the photodetector is to be formed, is etched away by using photolithography and, thereafter, the silicon of the N type diffusion layer 2 is etched away by using the mask oxide film 3 as a mask to form a recess 14 about 1~3 $\mu$m deep in the N type diffusion layer 2. Thus, a structure shown in FIG. 4 is obtained.

Figure 5:
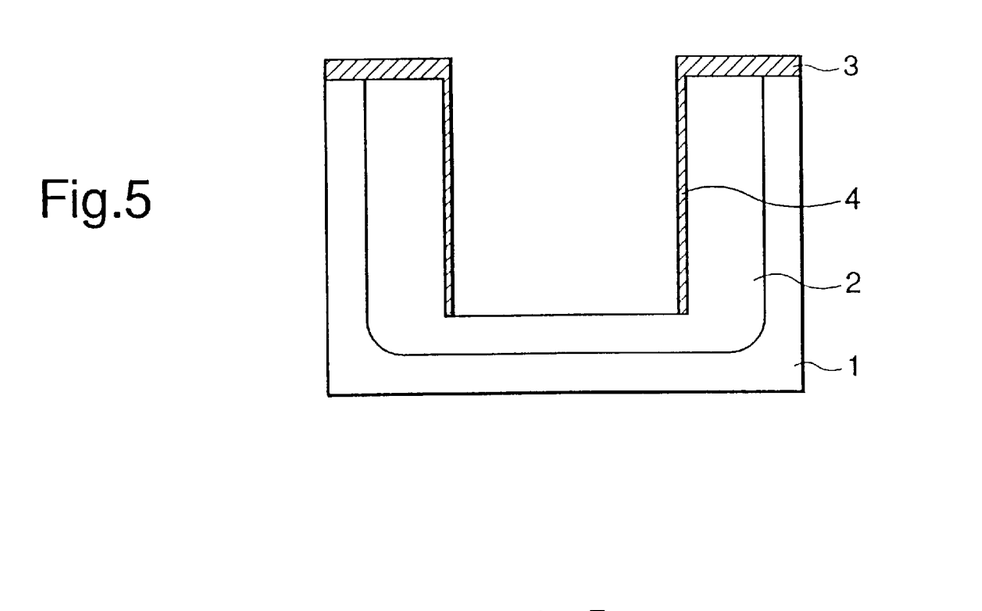

Thereafter, a silicon oxide film is deposited on the whole surface of the recess 14 and, then, the silicon oxide film on a bottom surface of the recess 14 is removed by etching it back to expose the N type diffusion layer 2 while leaving the silicon oxide film on a side surface of the recess 14 as a side wall oxide film 4, as shown in FIG. 5.

Figure 6:
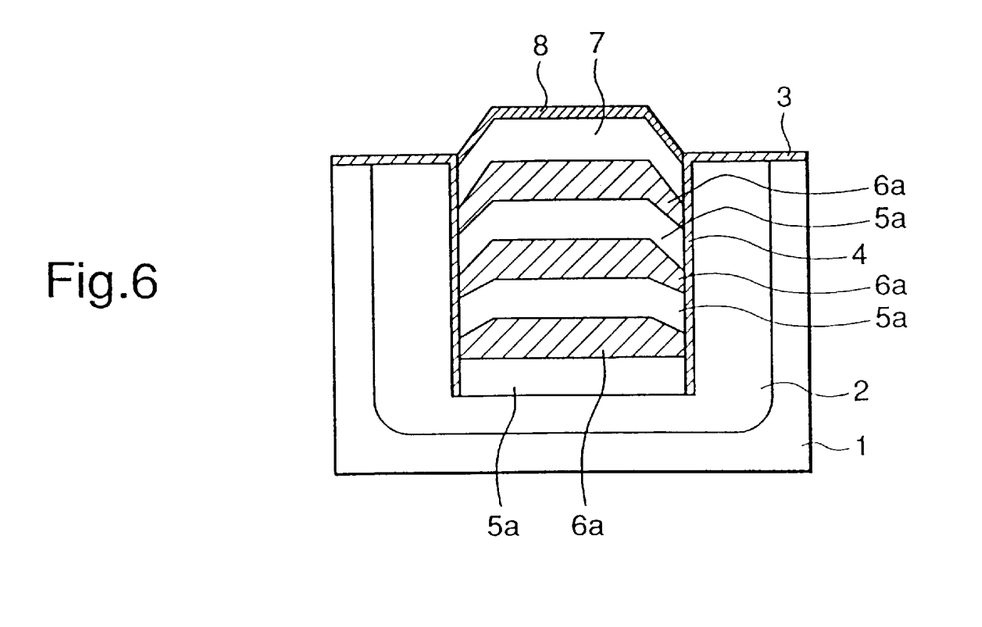

Then, the epitaxial silicon layers 5a and the epitaxial SiGe layers 6a are grown alternately on the exposed N type diffusion layer 2 in the bottom of the recess 14 by selective epitaxial growth technology and, then, the silicon buffer layer 7 and the P$^+$ type contact layer 8 are grown on the uppermost epitaxial SiGe layer 6a, in the order, as shown in FIG. 6.

Further, after the cover oxide film 9 having substantially the same thickness as that of the mask oxide film 3 is grown on the surface of the wafer, the anode contact hole 10 and the cathode contact hole 11 are formed in the cover oxide film 9 and the anode electrode 12 and the cathode electrode 13 are formed, as shown in FIG. 1.

Through the steps mentioned above, the photodetector as shown in FIG. 1 is fabricated.

Since the surface energy stability in epitaxially growing the SiGe layer is low as compared to a case where the silicon layer is epitaxially grown, a facet becomes noticeable due to, mainly, the lattice misalignment. Although there is, of course, some facet in the silicon layer, it can be negligible in comparism with the facet in the SiGe layer.

Therefore, the step caused by the facet formation is substantially proportional to a sum of the thicknesses of the epitaxial SiGe layers 6a. When the epitaxial SiGe layers 6a have the same thickness, the thickness of the epitaxial SiGe layers 6a in center portions thereof is $T_{SiGe}\times3$ in this embodiment and the thickness of the epitaxial SiGe layers 6a in peripheral portions thereof is $T_{SiGe}\times\alpha\times3$ in this embodiment, where $T_{SiGe}$ is the thickness of the epitaxial SiGe layer 6a and $\alpha<1$ because, in this embodiment the epitaxial SiGe layers 6a are constituted from 3 layers.

Accordingly, it is possible to substantially remove the step by establishing the following relation:

$$d=T_{Si}\times3+T_B+T_{P+}+3T_{SiGe}$$

where d is the depth of the recess 14, $T_{Si}$ is the thickness of the epitaxial silicon layer 5a, $T_B$ is the thickness of the silicon buffer layer 7 and $T_{P+}$ is the thickness of the P$^+$ type contact layer.

Further, in a case where $T_{Si}=T_{SiGe}$, the following relation is derived from the above relation:

$$d=3T_{SiGe}+T_B+T_{P+}+3\alpha T_{SiGe}=3(1+\alpha)T_{Si}+T_B+T_{P+}$$

Therefore, it is enough to grow the silicon buffer layer 7 such that the following relation is satisfied:

$$T_B=d-3(1+\alpha)T_{Si}-T_{P+}$$

Figure 19:
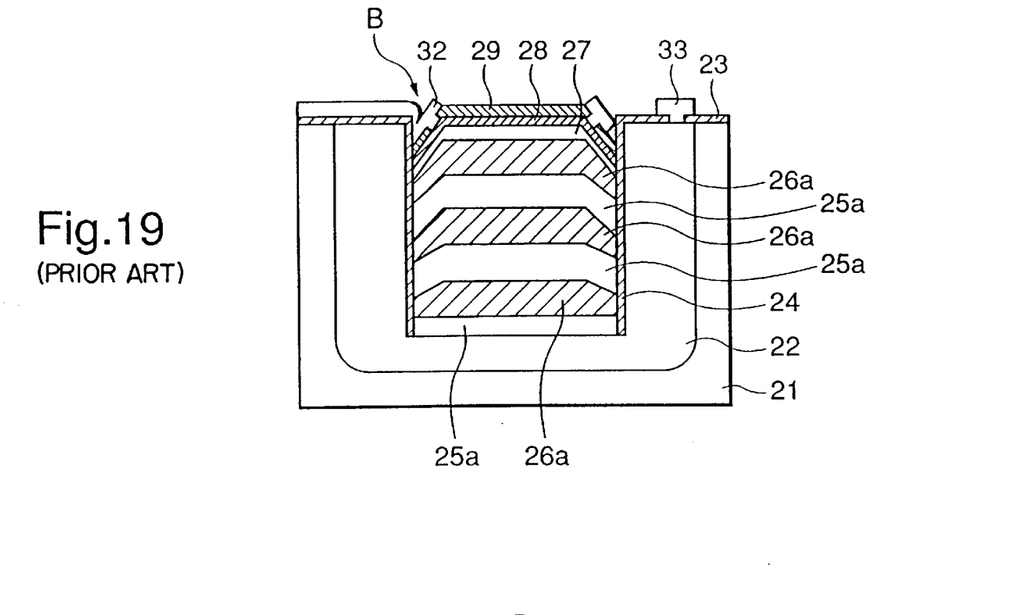
FIG. 19 shows a cross sectional view of a conventional photodetector.

In order to improve the optical sensitivity of the photodetector, the thickness of the light absorbing layer is increased. As mentioned previously, in the conventional photodetector such as shown in FIG. 19, the large facet is formed when the peripheral portion of the growing plane in growing the selective epitaxial layers and a large step is thereby formed in the peripheral portion of the recess in which the photodetector is formed. Therefore, the anode electrode 32 can be broken at the step resulting from the facet.

In the photodetector according to this embodiment, however, the step produced due to the facet formation can be reduced by making the total thickness of the silicon layers 5a, the SiGe layers 6a, the silicon buffer layer 7 and the P$^+$ contact layer 8 larger than the depth of the recess in growing the silicon layers 5a and the SiGe layers 6a alternately as the light absorbing layer the silicon buffer layer 7 and the P$^+$ contact layer 8 continuously to the light absorbing layer in the recess by selective epitaxial growth technology. Therefore, it becomes possible to smoothly derive a lead portion of the anode electrode 12 externally and the problem of breakage of the lead portion is removed and, accordingly, reliability is substantially improved.

Further, since, in such case, the thickness of the light absorbing layer is made larger than the depth of the recess compared with the case where the total thickness of the epitaxially grown layers is the same as the depth of the recess, the quantum efficiency of the photodetector is improved.

In the present invention, it is most preferable to make the total thickness of the epitaxially grown layers in the peripheral portion in the recess exactly the same as the depth of the recess by making (the total thickness of the epitaxially grown layers (in the center portion of the recess))>(the depth of the recess).

However, since it is sufficient if there is no breakage of the electrode wiring even if a small step is produced, it is sufficient to make the total thickness of the epitaxially grown layers in the peripheral portion in the recess substantially the same as the depth of the recess. In detail, since electrode wiring (aluminum electrode wiring) 500~800 nm thick is usually used, the height of the step produced should be less than the step and the lamination of the selectively grown epitaxial layers is preferably not protrude from the peripheral portion of the recess. Therefore, it is preferable that the total thickness of the epitaxially grown layers in the peripheral portion in the recess is in a range from −500 nm to 0 nm with respect to the depth of the recess. The total thickness of the layers in the peripheral portion is most preferably 0 nm, the same as the depth of the recess, as mentioned above.

Figure 7:
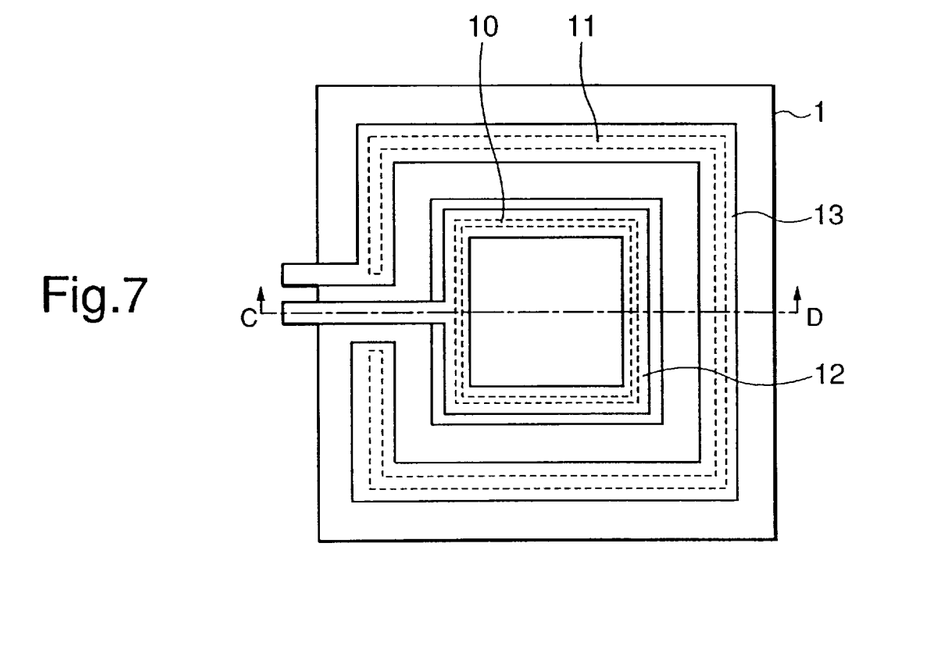
FIG. 7 shows a plan view of the photodetector according to a second embodiment of the present invention.
Figure 8:
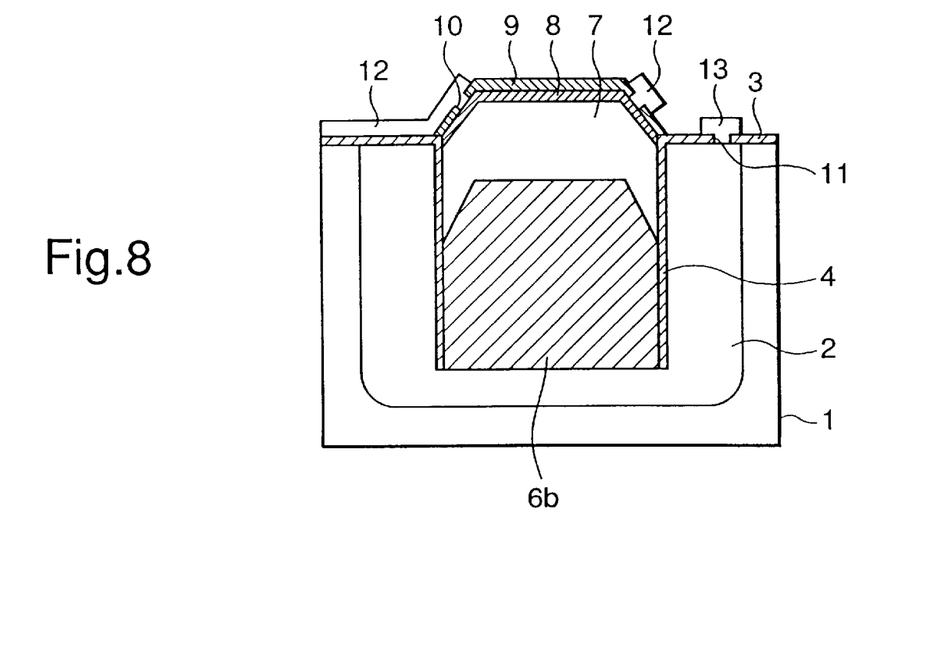
FIG. 8 shows a cross sectional view taken along a line C–D in FIG. 7.

FIGS. 7 and 8 show a photodetector according to a second embodiment of the present invention and the same components as those of the first embodiment are depicted by the same reference numerals, respectively.

A difference of the second embodiment from the first embodiment is in that the light absorbing layer of the second embodiment comprises a single epitaxial SiGe layer 6b.

A fabrication steps of the photodetector according to the second embodiment will be described with reference to FIGS. 9 to 12.

Figure 9:
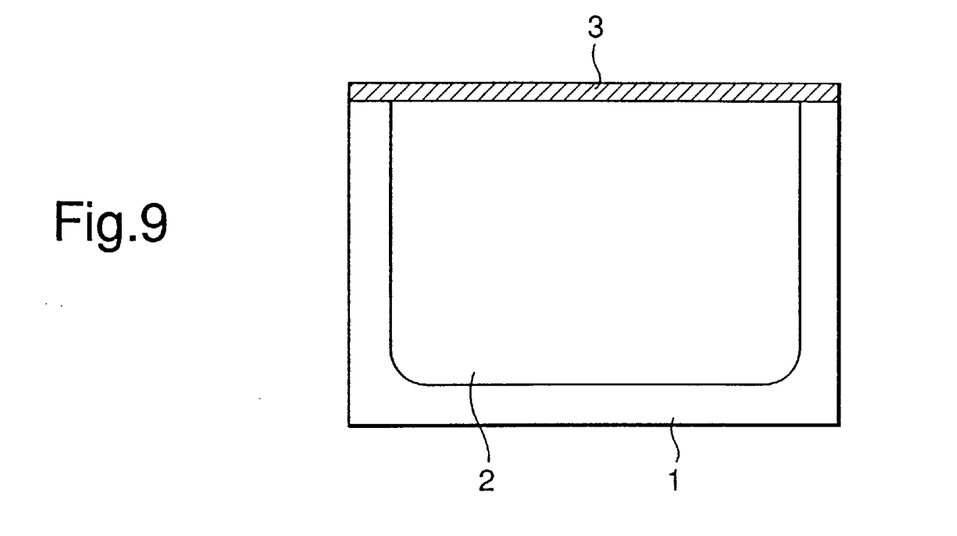
FIGS. 9 to 12 show cross sectional views indicating fabrication steps of the photodetector shown in FIG. 7.

First, as shown in FIG. 9, an N type diffusion layer 2 is formed in a silicon substrate 1 by forming a resist mask (not shown) on the substrate 1, selectively injecting arsenide ion through the resist mask to the silicon substrate 1 at a dose of about $1\times10^{15}$ cm$^{-2}$ and, then, heat-treating it at a temperature not lower than 1000° C. Thereafter, a mask oxide film 3 is grown on the whole surface of the wafer.

Figure 10:
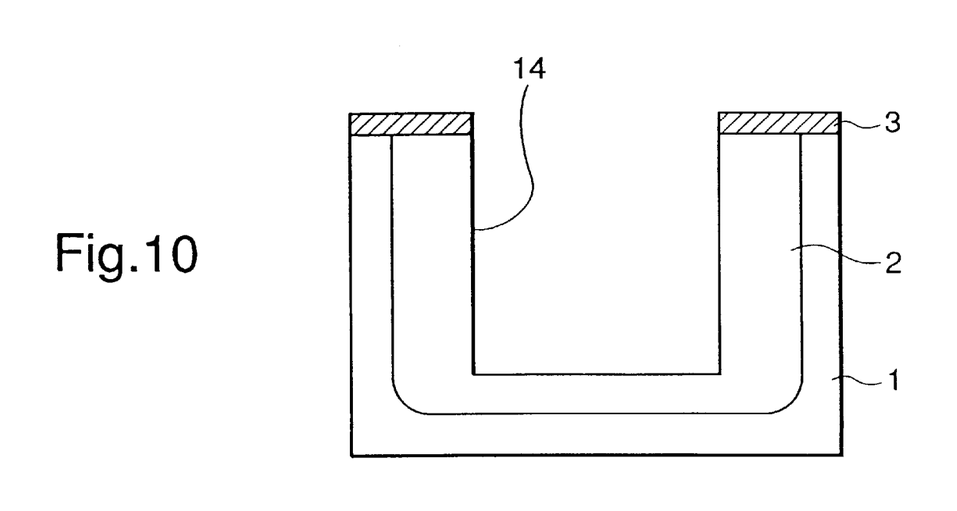

Subsequently, a portion of the mask oxide film 3, in which the photodetector is to be formed, is etched away by using photolithography and, thereafter, the silicon of the N type diffusion layer 2 is etched away by using the mask oxide film 3 as a mask to form a recess 14 about 1~3 μm deep and having a flat bottom in the N type diffusion layer 2, resulting in a structure shown in FIG. 10.

Figure 11:
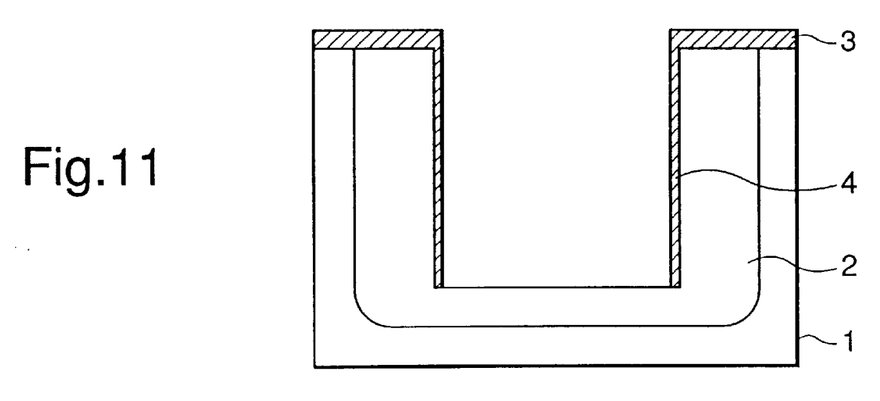

Thereafter, a silicon oxide film is deposited on the whole surface of the recess 14 and, then, the silicon oxide film on a bottom surface of the recess 14 is removed by etching it back to expose the N type diffusion layer 2 while leaving the silicon oxide film on a side surface of the recess 14 as a side wall oxide film 4, as shown in FIG. 11. The steps up to this are the same as those in the first embodiment.

Figure 12:
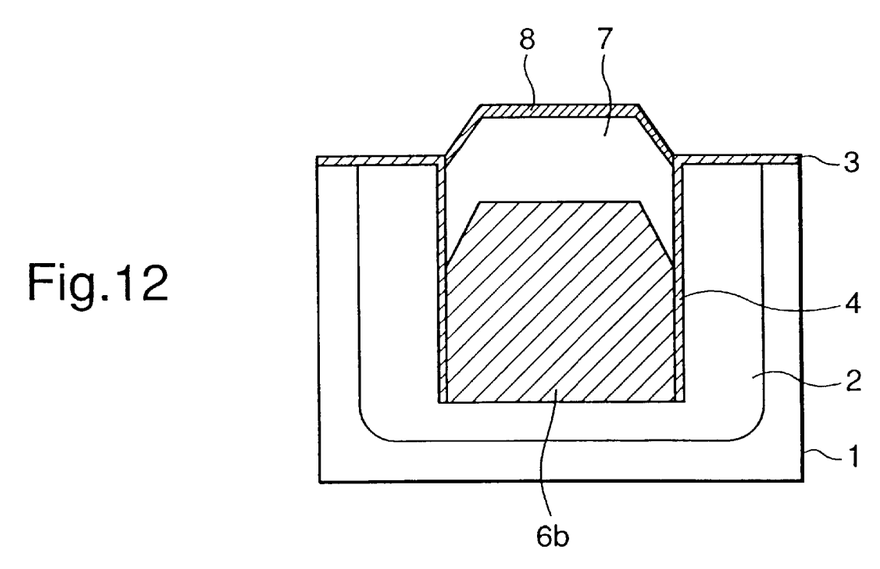

Then, the epitaxial SiGe layer 6b is grown on the exposed N type diffusion layer 2 in the bottom of the recess 14 by selective epitaxial growth technology, then, a silicon buffer layer 7 and a P$^+$ type contact layer 8 are grown on the epitaxial SiGe layer 6b, in the order, as shown in FIG. 12.

Further, after a cover oxide film 9 is grown on the surface of the wafer, an anode contact hole 10 and a cathode contact hole 11 are formed in the cover oxide film 9 and an anode electrode 12 and a cathode electrode 13 are formed.

Through the steps mentioned above, the photodetector such as shown in FIG. 8 is fabricated.

Since the light absorbing layer of the photodetector according to the second embodiment comprises the single epitaxial SiGe layer 6b, a step produced by the facet formation is substantially proportional to the thickness of the epitaxial SiGe layer 6b.

Therefore, it is possible to substantially completely remove the step by making ((the thickness of the silicon buffer layer 7)+(the thickness of the P$^+$ contact layer))=((the thickness of the epitaxial SiGe layer 6b)×α(<1)). Therefore, the second embodiment is superior than the first embodiment in which the light absorbing layer is composed of a plurality of epitaxial layers in that the design of the optimum thickness of the light absorbing layer is facilitated.

Figure 13:
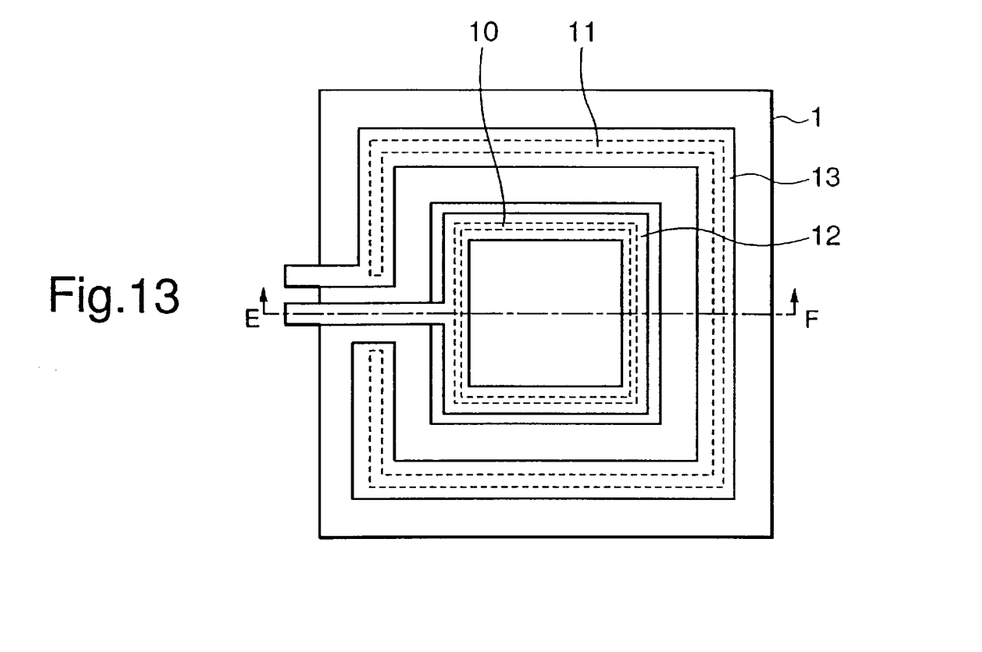
FIG. 13 shows a plan view of the photodetector according to a third embodiment of the present invention.
Figure 14:
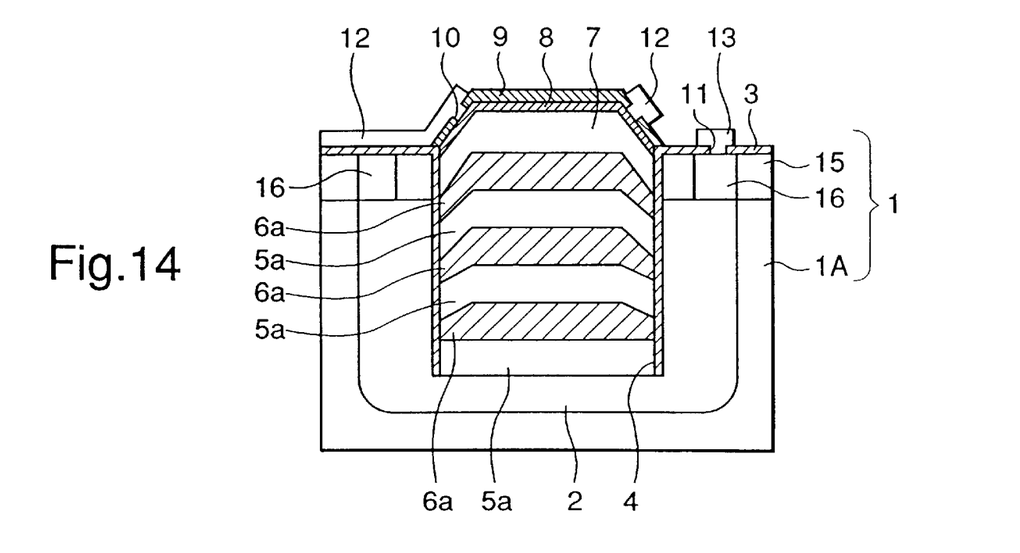
FIG. 14 shows a cross sectional view taken along a line E–F in FIG. 13.

FIGS. 13 and 14 show a photo detection according to a third embodiment of the present invention.

The third embodiment differs from the first embodiment in that a silicon substrate 1 is constructed with a P type silicon substrate 1A on which an N type diffusion layer 2 is formed and an N type epitaxial layer 15 grown on the P type silicon substrate 1A.

The photodetector according to the third embodiment includes the N type silicon epitaxial layer 15 having a thickness of 1 μm and a recess having a bottom reached up to an interior of the N type diffusion layer 2. In the recess, epitaxial silicon layers 5a and epitaxial SiGe layers 6a are formed alternately as a light absorbing layer on which a silicon buffer layer 7 and a P$^+$ type silicon contact layer 8 are formed in the order.

A surface of the N type epitaxial layer 15 is coated with a mask oxide film 3 and a surface of the silicon buffer layer 7 is coated with a cover oxide film 9. Further, a cathode electrode 13 of the photodetector is connected to a high impurity concentration N$^+$ type contact layer 16 through a cathode contact 11 formed in the mask oxide film 3 and an anode electrode 12 is connected to the P$^+$ type silicon contact layer 8 through an anode contact 10 formed in the cover oxide film 9.

A fabrication steps of the photodetector shown in FIG. 14 will be described with reference to FIGS. 15 to 18.

Figure 15:
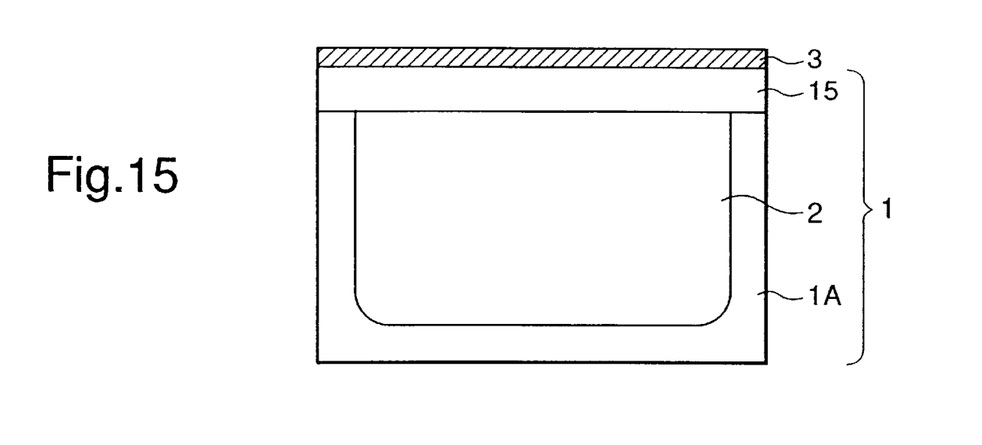
FIGS. 15 to 18 show cross sectional views indicating fabrication steps of the photodetector shown in FIG. 13.

First, as shown in FIG. 15, an N type diffusion layer 2 is formed in a P type silicon substrate 1A or in a P type region of the silicon substrate 1A by selectively injecting arsenide ion through, for example, a resist mask (not shown) to the silicon substrate 1A at a dose of about $1\times10^{15}$ cm$^{-2}$ and, then, heat-treating it at a temperature not lower than 1000° C. Then, after the silicon substrate 1 comprising the silicon substrate 1A and the N type epitaxial layer 15 is constructed by growing the N type epitaxial layer 15 about 1 μm, the mask oxide film 3 of silicon oxide is grown on the whole surface of the wafer.

Figure 16:
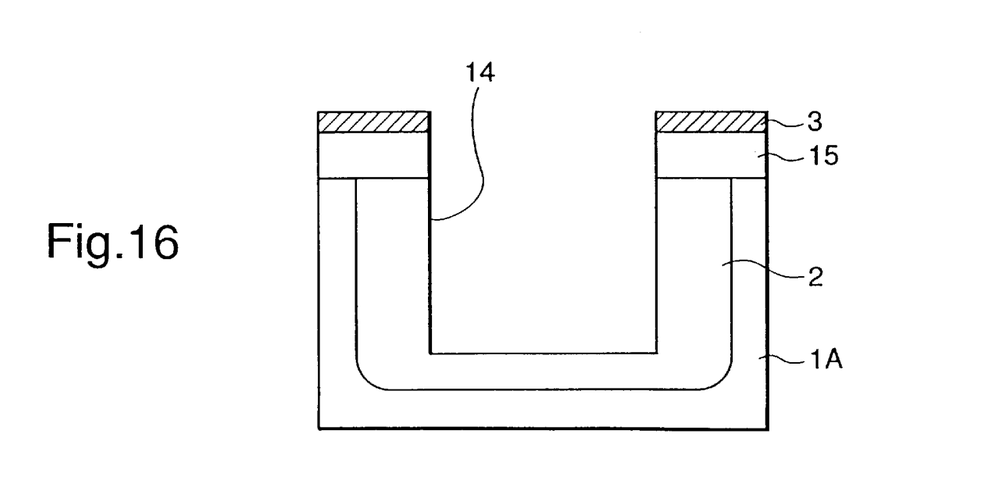

Subsequently, a portion of the mask oxide film 3, in which the photodetector is to be formed, is etched away by using photolithography and, thereafter, the silicon of the N type epitaxial layer 15 and the N type diffusion layer 2 is etched away by using the mask oxide film 3 as a mask to form a recess 14 about 1~3 μm deep in the N type diffusion layer 2, as shown in FIG. 16.

Figure 17:
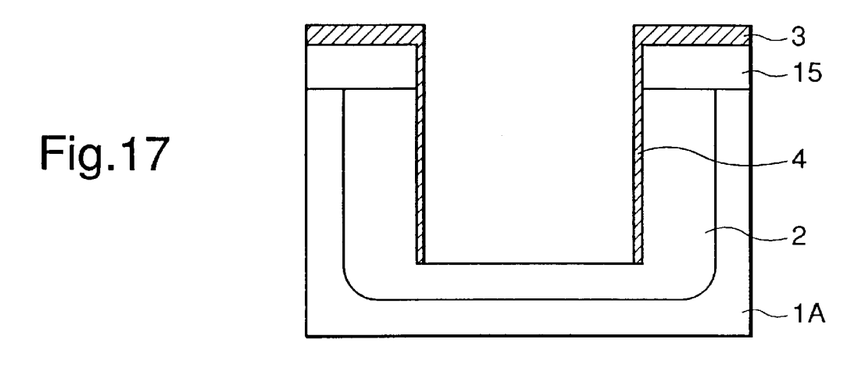

Thereafter, a silicon oxide film is deposited on the whole surface of the recess 14 and, then, the silicon oxide film on a bottom surface of the recess 14 is removed by etching it back to expose the N type diffusion layer 2 while leaving the silicon oxide film on a side surface of the recess 14 as a side wall oxide film 4, resulting in a structure as shown in FIG. 17.

Figure 18:
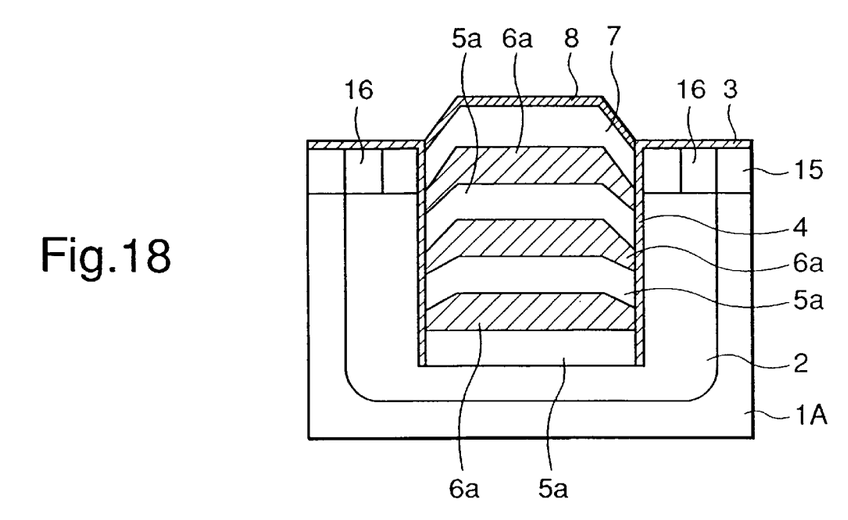

Then, the high impurity concentration N type contact layer 16 is formed by injecting, for example, phosphor ion into a portion in which the cathode contact 11 is to be formed and heat-treating it, as shown in FIG. 18.

Further, after the cover oxide film 9 is grown on the surface of the wafer, the anode contact hole 10 and the cathode contact hole 11 are formed in the cover oxide film 9 and the anode electrode 12 and the cathode electrode 13 are formed.

Through the steps mentioned above, the photodetector such as shown in FIG. 14 is fabricated.

Although the method for making the step caused by the facet formation equal to zero is the same as that in the first embodiment, the third embodiment is superior than the first embodiment in that it is easily possible to form a bipolar transistor in another portion of the same substrate, because, in the third embodiment, the N type diffusion layer 2 can be concurrently used as a burying layer of the bipolar transistor due to the existence of the N type epitaxial layer 15.

As described hereinbefore, a first effect of the present invention resides in that the possibility of breakage of the lead wiring of the anode electrode of the photodetector is nullified and thus the reliability of the photodetector is improved even when the step due to facet formation becomes remarkable by increasing the thickness of the light absorbing layer in order to improve the optical sensitivity of the photodetector.

The reason for this is that, since the light absorbing layer and the contact layer are grown in the recess to the thickness exceeding the depth of the recess, the step due to the facet formation in the peripheral portion in the recess can be reduced or removed according to the growing thickness of the layers.

A second effect of the present invention resides in that it is possible to improve the quantum efficiency without changing the depth of the recess.

This is because the thickness of the light absorbing layer is increased since the total thickness of the light absorbing layer and the contact layer is larger than the depth of the recess.

What is claimed is:

1. A photodetector comprising:
   a semiconductor substrate having a main surface;
   a first insulating layer formed on said main surface of said semiconductor substrate;

a recess portion formed in said semiconductor substrate;

a light absorbing layer formed in said recess portion, wherein said light absorbing layer comprises at least one first epitaxial layer and at least one second epitaxial layer, said first and second epitaxial layers being laminated alternately, and wherein said light absorbing layer has a central portion and a peripheral portion, said peripheral portion being thinner than said central portion when measured in a direction parallel to a thickness direction of said photodetector;

a buffer layer having a central portion formed on said central portion of said light absorbing layer and a peripheral portion formed on said peripheral portion of said light absorbing layer;

a contact layer having a central portion formed on said central portion of said buffer layer and a peripheral portion formed on said peripheral portion of said buffer layer;

a second insulating layer having a central portion formed on said central portion of said contact layer and a peripheral portion formed on said peripheral portion of said of said contact layer, wherein said peripheral portion of said second insulating layer is substantially outside of said recess portion and projecting from said main surface of said semiconductor substrate;

a first contact hole formed through said first insulating layer;

a second contact hole formed through said peripheral portion of said second insulating layer;

a first electrode formed through said first insulating layer and electrically connected to said semiconductor substrate through said first contact hole; and a second electrode formed on said second insulating layer outside of said recess portion and electrically connected to said contact layer through said second contact hole.

2. The photodetector as claimed in claim 1, wherein said first epitaxial layer is an epitaxial silicon layer, and said second epitaxial layer is an epitaxial SiGe layer.

3. A photodetector device comprising:

a semiconductor substrate having a main surface;

a first insulating layer formed on said main surface of said semiconductor substrate;

a recess portion formed in said semiconductor substrate, said recess portion formed to a predetermined depth measured along an axtis substantially normal to said main surface;

a light absorbing layer formed in said recess portion, said light absorbing layer comprising at least one epitaxial layer, wherein said light absorbing layer has a central portion and a peripheral portion;

a buffer layer formed on said light absorbing layer;

a contact layer formed on said buffer layer;

wherein a combined thickness of said light absorbing layer, said buffer layer and said contact layer, when measured along the axis normal to said main surface at said central portion of said light absorbing layer, is greater than the depth of said recess portion;

a second insulating layer formed on said contact layer having a central portion formed above and corresponding to said central portion of said light absorbing layer, and a peripheral portion, wherein said peripheral portion of said second insulating layer is positioned substantially outside of said recess portion and, in part, above said main surface of said semiconductor substrate and, in part, above said light absorbing layer;

a first contact hole formed through said first insulating layer;

a second contact hole formed through said peripheral portion of said second insulating layer;

a first electrode on said first insulating layer and passing through said first contact hole; and a second electrode formed substantially outside said recess portion and passing through said second contact hole.

4. A photodetector device as claimed in claim 3, wherein said light absorbing layer comprises a plurality of alternating layers of epitaxial silicon and epitaxial SiGe.

5. A photodetector device comprising:

a semiconductor substrate having a main surface;

a first insulating layer formed on said main surface of said semiconductor substrate;

a recess portion formed in said semiconductor substrate and having a depth;

a light absorbing layer formed in said recess portion, said light absorbing layer comprising a plurality of formed semiconductor layers, each of said plurality of semiconductor layers having a central portion and a peripheral portion, wherein said light absorbing layer has a corresponding central portion and a corresponding peripheral portion;

a buffer layer formed on said light absorbing layer;

a contact layer formed on said buffer layer;

wherein a total thickness of the combined peripheral portions of said semiconductor layers in said recess portion is substantially the same as said depth of said recess portion;

a second insulating layer formed on said contact layer having a central portion formed substantially above and corresponding to said central portion of said light absorbing layer, and a peripheral portion formed substantially outside said recess portion and juxtapositioned above a portion of said main surface of said semiconductor substrate and a portion of said peripheral portion of said light absorbing layer;

a first contact hole formed through said first insulating layer;

a second contact hole formed through said peripheral portion of said second insulating layer;

a first electrode passing through said first contact hole; and a second electrode passing through said second contact hole and maintained substantially outside said recess portion.

6. A photodetector device as claimed in claim 5, wherein said light absorbing layer comprises a plurality of layers of epitaxial silicon and epitaxial SiGe.

* * * * *